United States Patent [19]

Boyle

[11] Patent Number: 4,628,303

[45] Date of Patent: Dec. 9, 1986

[54] VISUAL MONITOR FOR ELECTRICAL SIGNALS

[75] Inventor: Richard C. Boyle, Springfield, Pa.

[73] Assignee: System Development Corporation, McLean, Va.

[21] Appl. No.: 741,474

[22] Filed: Jun. 5, 1985

[51] Int. Cl.⁴ .............................................. G08B 21/00
[52] U.S. Cl. ..................................... 340/661; 307/236; 307/311; 324/133; 328/118; 330/59; 340/664
[58] Field of Search ........................ 340/661, 664, 645; 324/133, 127, 83 R; 307/311, 236; 328/148, 118; 330/59, 110, 308; 315/135

[56] References Cited

U.S. PATENT DOCUMENTS

| | | | |
|---|---|---|---|
| 3,509,369 | 4/1970 | Crouse et al. | 307/236 X |
| 3,705,316 | 12/1972 | Burrows et al. | 307/311 |
| 3,916,326 | 10/1975 | Woyton | 328/118 |
| 3,943,367 | 3/1976 | Baker | 330/59 X |
| 4,145,721 | 3/1979 | Beaudouin et al. | 307/311 |
| 4,218,613 | 8/1980 | Blete | 307/311 X |
| 4,476,439 | 10/1984 | Sato | 330/110 X |
| 4,492,931 | 1/1985 | Deweck | 330/59 X |

FOREIGN PATENT DOCUMENTS 4277  1/1977  Japan ................................... 324/133

Primary Examiner—James L. Rowland
Assistant Examiner—Daniel Myer
Attorney, Agent, or Firm—Francis A. Varallo; Mervyn L. Young; Kevin R. Peterson

[57] ABSTRACT

A circuit for monitoring the status of electrical signals, such as those present on the control and data lines of an RS-232 interface, includes a single operational amplifier and a dual-color LED indicator. The electrical characteristics of the LED's form a significant part of the circuit parameters. The monitor design provides a predetermined circuit input impedance and positive/negative switching thresholds to effect the selective illumination of the LED's.

6 Claims, 3 Drawing Figures

VISUAL MONITOR FOR ELECTRICAL SIGNALS

BACKGROUND OF THE INVENTION

In the operation of electronic equipment, such as data processors, it is often necessary to provide an indication of the state of various lines carrying electrical signals. For example, in applications involving an RS-232 type interface, test procedures may be implemented to obtain a visual indication of the state of each control and data line, including minimum operating voltage thresholds. Often, a large number of parallel interfaces must be monitored simultaneously, and the visual indication, discernible at a considerable distance from the monitor.

Present day monitoring circuits generally embody two separate amplifiers for signal voltage levels respectively above and below zero volts. Two separate voltage reference sources are required, along with a pair of output isolation elements, interposed between the respective output terminals of the amplifiers and the LED indicating device. The last mentioned device is driven by the monitor circuit, but its electrical characteristics do not play an active role in the monitor circuit design parameters.

It is apparent from the foregoing considerations that present day circuits used to monitor a large plurality of interfaces simultaneously, require a correspondingly large number of discrete components, along with LED indicators of comparatively large physical size. Power requirements for such an arrangement are also large. What is desirable is a monitor circuit with a minimal parts count and low power requirement. In fact, such a circuit is mandated in portable test equipment of the "suitcase" type, where space is extremely limited. The LED monitor circuit of the present invention fills such a need.

SUMMARY OF THE INVENTION

In accordance with the present invention, there is provided a monitor circuit comprised of a dual LED indicating device and a non-inverting operational amplifier. Both the input impedance of the circuit and the switching thresholds of the amplifier may be predetermined by selecting the resistance values of an input network. Such values in turn determine the input voltage applied to an amplifier input terminal for a given signal voltage applied to the monitor circuit.

The amplifier gain characteristic passes through three distinct operating regions, as the level of the input signal traverses acceptable limits. The output of the amplifier is coupled via a current limiting resistor to a terminal common to a pair of inversely connected LED components. The other terminal of the dual LED device is connected to a second input terminal of the operational amplifier. As will be considered in detail hereinafter, the operating characteristics of the dual LED device form part of the monitor circuit parameters. Thus, the device is not merely driven by the circuit, but is instead an integral, essential part thereof. The foregoing circuit arrangement uses approximately half the number of components employed in the aforementioned present day circuit.

In operation, the monitor circuit of the present invention responds to predetermined positive and negative threshold voltages. Assuming that the dual LED device is a two-color indicator, a first color may be observed upon attainment of a positive threshold by the amplifier and a second color, upon attainment of a negative threshold. The former may represent an "ON" condition for the line being monitored; the latter, an "OFF" condition. If neither color indication is observed, the input signal level is less than the minimum threshold.

Other features and advantages of the signal monitor of the present invention will become apparent in the detailed description of the invention which follows.

BRIEF DESCRIPTION OF THE DRAWING

FIG. 2 is a graph illustrating the three distinct regions of the gain of the operational amplifier of FIG. 1, as a function of the input signal level to the monitor.

DESCRIPTION OF THE PREFERRED EMBODIMENT

Figure 1:
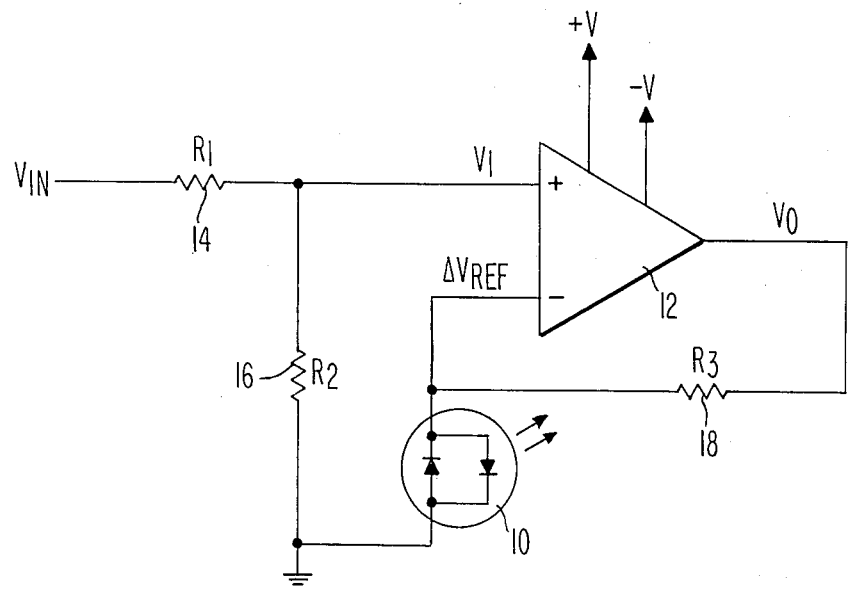

Reference to the electrical schematic of FIG. 1 reveals the presence of two active elements, namely, a dual LED indicator 10 having a pair of inverse-connected LED's and a non-inverting operational amplifier 12.

The input signal $V_{IN}$ to be monitored is applied to one extremity of a resistive divider comprised of resistors 14 and 16. The opposite extremity of the divider is connected to ground. The voltage $V_1$ at the common point of the last mentioned resistors is applied to the positive (+) input terminal of amplifier 12. Amplifier 12 is coupled to respective positive and negative sources, $+V$ and $-V$ of supply potential. The output voltage $V_0$ of the amplifier 12 is applied via resistor 18 to one of a pair of terminals of LED indicator 10, the last mentioned terminal being connected to the negative (−) input terminal of amplifier 12. The voltage appearing on the amplifier negative input terminal is designated $\Delta V_{REF}$. The other terminal of LED indicator 10 is grounded.

Figure 2:
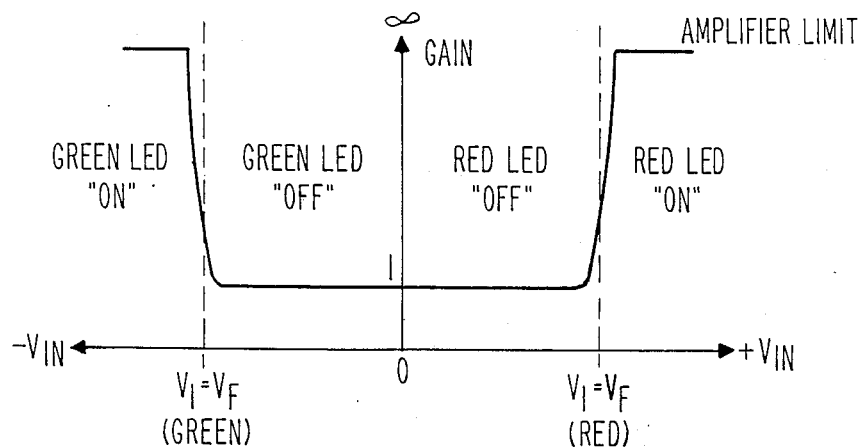
FIG. 2 is a schematic diagram of the monitor circuit of the present invention.

The input impedance and the switching thresholds of the circuit of FIG. 1 are predetermined in accordance with selected values for resistors 14 and 16. Moreover, such values determine the amplifier input voltage $V_1$ for a given value of signal voltage $V_{IN}$. $\Delta V_{REF}$ is a function of $V_1$, the amplifier gain, and the forward voltage $(V_F)$ characteristic of the LED's in indicator 10. As indicated by the graph of FIG. 2, for low absolute voltage values of $V_1$, the gain of operational amplifier 12 is approximately one. That is, the absolute value of $V_1$ is equal to or less than the absolute value of $V_{REF}$, which in turn is less than $V_F$ of the LED's of indicator 10. In effect, for $|V_1| < V_F$, the LED indicator 10 is out of the circuit, and the amplifier output $V_0 \approx V_1$.

When $|V_1|$ begins to exceed $V_F$, $\Delta V_{REF}$ becomes fixed at the value of $V_F$. The gain of amplifier 12 begins to increase exponentially toward infinity with increasing absolute values of $V_1$. This results in increasing current flow through the forward biased LED of the indicator 10. The latter LED turns "ON". In summary, the forward biased LED of indicator 10 is "OFF" when $|V_1| \leq |V_{REF}| \leq V_F$ and is "ON" when $|V_1| > |V_{REF}| = V_F$.

Therefore, if the forward voltage characteristics of the LED devices are known, a proper selection of the values of resistors 14 and 16 will provide the desired input impedance and positive/negative switching thresholds for the monitor circuit of FIG. 1. It should be observed that the circuit permits not only an observation of the "ON" and "OFF" states of the interface being monitored, but also provides an indication of whether or not minimum voltage thresholds on the interface are being met. For example, assuming that the dual LED indicator includes a red LED and a green LED, the monitor circuit arrangement may be such that when the red LED is "ON", the interface is "ON"; when the green LED is "ON", the interface is "OFF". On the other hand, with both LED's "OFF", the minimum absolute threshold voltage has not been attained. These conditions are illustrated graphically in FIG. 2.

As noted hereinbefore, an electrical characteristic, specifically $V_F$, the forward voltage of the LED's of indicator 10 plays an important role in the monitor circuit design. Since $$V_1 = \frac{R_2 V_{IN}}{R_1 + R_2},$$

if $V_{IN}$ is equal to "$V_{IN}$ desired switching threshold"; $V_1$ is equal to $V_F$ of the LED's; and $Z_{IN}$ impedance = $R_1 + R_2$, then the following three design equations are used to determine the values of $R_1$, $R_2$ and $R_3$ in FIG. 1.

$$R_2 = \frac{(V_F)(Z_{IN})}{V_{IN}} \quad (1)$$

$$R_1 = Z_{IN} - R_2 \quad (2)$$

$$R_3 = \frac{V_0}{I} \quad (3)$$

wherein $V_0$ is the clamp voltage of amplifier 12 and
I is the maximum desired LED current In an actual operative circuit embodiment, indicator 10 is a dual color light emitting diode (type MV 9471) having a $V_F$ of approximately 2.0 volts. The operational amplifier (¼ of Fairchild 4136) has an output which is "lock-up" proof and has a maximum output swing $V_0$ of approximately ±8 volts for supply potentials V of ±12 volts. That is, ±8 volts is equal to the clamp voltage. The desired input resistance was chosen as 9500 ohms and the LED devices are to switch "ON" respectively at plus and minus 5.5 volts. Moreover, the desired LED current through indicator 10 was limited to 25 milliamperes.

Using the foregoing parameters in equations (1), (2) and (3), the calculated values of $R_1$, $R_2$ and $R_3$ resulted in practical values of 3300 ohms, 6340 ohms, and 330 ohms respectively.

Figure 3:
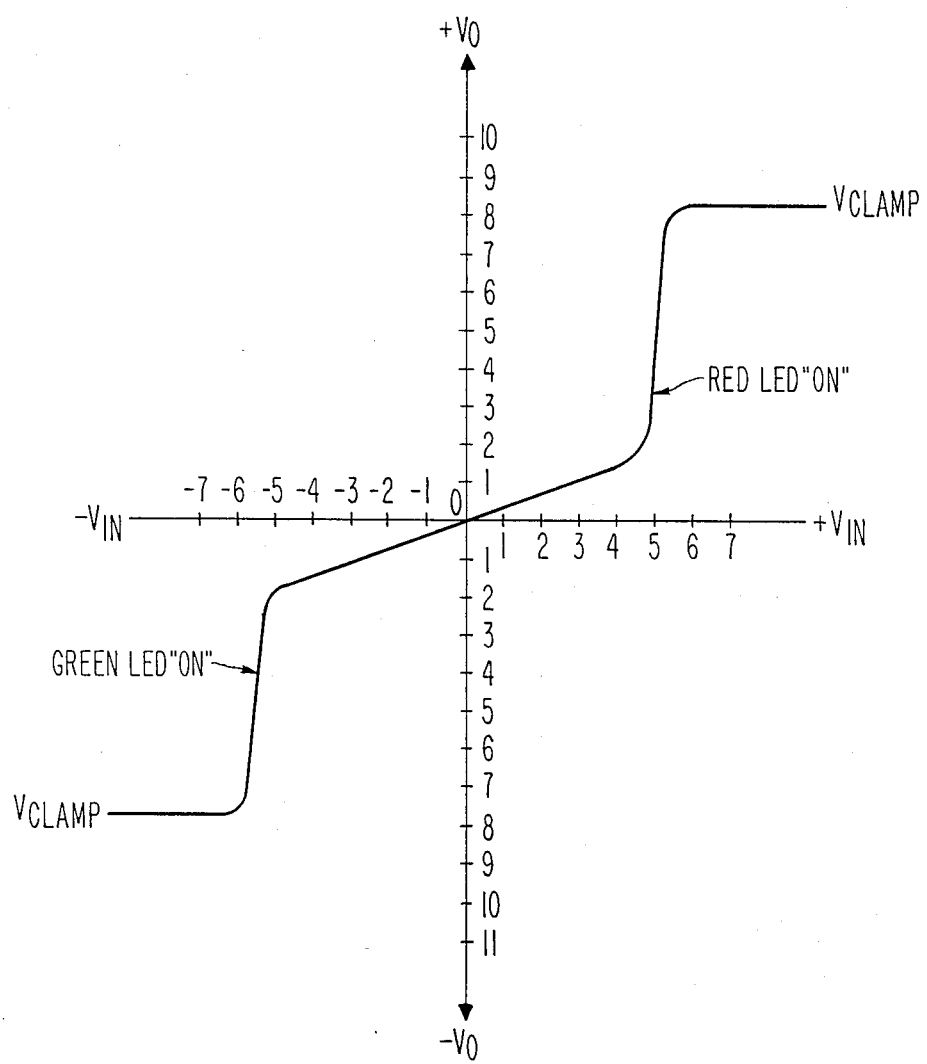
FIG. 3 is a graph of the amplifier output voltage versus signal input voltage for an actual operative circuit embodiment.

In FIG. 3, the output voltage $V_0$ of amplifier 12 is plotted against the input voltage $V_{IN}$ of the operative monitor embodiment. For a $V_{IN}$ of approximately 5.0 to 5.5 volts, plus or minus, a respective LED in indicator 10 is turned "ON".

In conclusion, the monitor circuit of the present invention provides a saving of at least fifty percent of the parts count for circuits which provide a similar function, with concomitant savings in electrical power and physical space requirements. The circuit elements and parameters associated therewith, as presented hereinbefore, refer to an actual operative monitor; are submitted solely for purposes of example; and are not to be construed as limitative of the invention. Changes and modifications of the monitor circuit organization presented herein may be needed to suit particular requirements. In view of the foregoing, all changes and modifications as are within the skill of the circuit designer, insofar as they are not departures from the true scope and spirit of the invention, are intended to be covered by the following claims.

What is claimed is:

1. A circuit for monitoring the status of electrical signals comprising:
    a circuit input terminal for receiving said electrical signals, a voltage divider network coupled between said input terminal and a source of reference potential,
    an operational amplifier having a first and a second input terminal and an output terminal, means coupling said first input terminal of said amplifier to a predetermined point on said divider network,
    an LED indicator having a pair of terminals, means coupling the output terminal of said operational amplifier in common to said second input terminal of said amplifier and to one of said terminals of said LED indicator, the other of said terminals of said LED indicator being coupled to said source of reference potential.

2. A monitor circuit as defined in claim 1 wherein said voltage divider network is comprised of a pair of series connected resistors, said predetermined point on said divider network being at the junction of said resistors, the respective values of said resistors being determinative of both the input impedance of said circuit and the threshold at which said electrical signals applied to said circuit input terminal effect an illumination of said LED indicator.

3. A monitor circuit as defined in claim 2 further characterized in that said means coupling the output terminal of said amplifier in common to said second input terminal of said amplifier and to one of said terminals of said LED indicator is a resistor for limiting the magnitude of current flowing through said LED indicator when the latter is illuminated.

4. A monitor circuit as defined in claim 3 wherein said LED indicator is comprised of a pair of inverse-connected LED's having respective different colors.

5. A monitor circuit as defined in claim 4 characterized in that said operational amplifier is coupled to positive and negative sources of supply potential.

6. A monitor circuit as defined in claim 5 further characterized in that said first and said second input terminals of said operational amplifier are respectively positive and negative amplifier inputs.

* * * * *